(12) United States Patent
Westphal

(10) Patent No.: US 6,351,125 B1
(45) Date of Patent: Feb. 26, 2002

(54) METHOD OF HOMOGENIZING MAGNETIC FIELDS

(75) Inventor: Michael Westphal, Offenbach (DE)

(73) Assignee: Bruker Analytik GmbH, Rheinstetten (DE)

(*) Notice: Subject to any disclaimer, the term of this patent is extended or adjusted under 35 U.S.C. 154(b) by 0 days.

(21) Appl. No.: 09/481,908

(22) Filed: Jan. 12, 2000

(30) Foreign Application Priority Data

Jan. 15, 1999 (DE) .......................................... 199 01 332

(51) Int. Cl.[7] ................................................. G01V 3/00
(52) U.S. Cl. ...................................... 324/320; 324/319
(58) Field of Search ................................ 324/320, 319, 324/318, 322; 335/216

(56) References Cited

U.S. PATENT DOCUMENTS

| | | | | |
|---|---|---|---|---|
| 3,622,869 A | | 11/1971 | Golay ......................... | 324/318 |
| 4,654,595 A | * | 3/1987 | Sepponen .................... | 324/318 |
| 4,771,244 A | | 9/1988 | Vermilyea .................... | 324/318 |
| 5,045,794 A | | 9/1991 | Dorri et al. .................. | 324/318 |
| 5,391,990 A | * | 2/1995 | Schmitt et al. .............. | 324/320 |
| 5,418,462 A | | 5/1995 | Breneman .................... | 324/318 |
| 5,485,088 A | | 1/1996 | Westpahl et al. ........... | 324/320 |
| 5,959,454 A | | 9/1999 | Westphal et al. ............ | 324/320 |

FOREIGN PATENT DOCUMENTS

EP     0 710 852     5/1996

* cited by examiner

Primary Examiner—Jay Patidar
Assistant Examiner—Brij B. Shrivastav
(74) Attorney, Agent, or Firm—Paul Vincent

(57) ABSTRACT

An iterative method of homogenizing the magnetic field in the working volume (8) of the main field magnet (1) of a magnetic resonance apparatus uses ferromagnetic homogenizing elements (6) which are mounted at predetermined positions (9) on one or more support bodies (5), wherein in a first measuring step, the profile of the magnetic field is determined through measurements and in a first calculation step, occupation by homogenizing elements (6) at the predetermined positions (9;29) is calculated such that the calculated overall field, i.e. a superposition of the magnetic field of the main field magnet with all homogenizing elements, is approximately homogeneous, wherein in a first compensation step, the calculated number of homogenizing elements is placed at the predetermined positions and subsequently, in a further measuring step, each respective magnetic field profile in the working volume is determined in iterations and afterwards, in a further calculation step, a change in the positions occupied by homogenizing elements is calculated for further improvement of the homogeneity and carried out in a further compensation step. The method is characterized in that the predetermined positions of the homogenizing elements are subdivided into groups having various distances from the geometric center of the working volume and that, starting from the second calculating step and the second compensating step, occupation of the positions of the group with the shortest distances from the center of the working volume is no longer changed. In this manner, it is possible to obtain a reliable convergence of the iteration steps and thus an improvement of the homogeneity of the main magnetic field when the errors in the contributions of the homogenizing elements to the overall magnetic field approach the order of magnitude of the field inhomogeneities being compensated.

20 Claims, 2 Drawing Sheets

METHOD OF HOMOGENIZING MAGNETIC FIELDS

FIELD OF THE INVENTION

The invention concerns an iterative method for homogenizing the magnetic field in the working volume of the main field magnet of a magnetic resonance apparatus using ferromagnetic homogenizing elements which are mounted at predetermined positions on one or more support bodies.

BACKGROUND OF THE INVENTION

A method of this type is known e.g. from U.S. Pat. No. 5,959,454.

Similar homogenizing devices with homogenizing elements of ferromagnetic material are known e.g. from U.S. Pat. No. 5,045,794 or U.S. Pat. No. 5,485,088 or U.S. Pat. No. 5,959,454 U.S. Pat. No. 3,622,869 discloses e.g. alternative methods of homogenizing using correction coils through which adjustable electric currents flow.

U.S. Pat. No. 5,045,794 describes a device and a method of homogenizing the magnetic field of the main field magnet of a typical magnetic resonance tomograph for medical diagnosis with a tubular cylindrical bore for the reception of a patient, and a nearly spherical working volume in the region of the geometric center of the bore which uses ferromagnetic homogenizing elements. Guiding rails are mounted in a longitudinal direction on the surface of the tubular bore into which e.g strip-shaped mechanical support bodies are inserted which can be provided with homogenizing elements of iron having e.g. disc-shaped design. The mechanical support bodies in the guiding rails thereby provide a plurality of predetermined locations or positions for fixing the homogenizing elements. In the magnetic field of the main field magnet, the homogenizing elements of iron are magnetized, approximately to their point of saturation, in a direction parallel to the axis of the bore. The relatively weak additional magnetic field of the magnetized homogenizing elements is superimposed on the relatively strong magnetic field of the main field magnet. The magnetic field in the working volume of the main field magnet is, in general, not sufficiently homogeneous for use in the magnetic resonance apparatus due to the mechanical tolerances in the structural components of the main field magnet coil. Through the choice of the geometric arrangement and the amount of homogenizing elements in the region surrounding the working volume, it is possible to create a spatial profile of the additional magnetic field generated by the homogenizing elements which largely compensates for the original inhomogeneity of the magnetic field of the main field magnet. With main field magnets of a bore diameter of 90 cm in a spherical working volume having a diameter of approximately 50 cm, typical values of the remaining field disturbances are e.g. on the order of magnitude of a few ppm. In the event that soft-magnetic homogenizing elements e.g. of iron are used, magnetization only occurs in the direction of the main field at the center of the magnet bore, however, not in the opposite direction. When using disc-shaped homogenizing elements whose normal direction extends perpendicularly to the axis of the magnet bore, one obtains an nearly fixed value for the magnetization, corresponding to saturated magnetization, even at relatively small magnetic field strengths of the main field corresponding to magnetic inductances in excess of 0.4 Tesla, due to the shape anisotropy of the homogenizing elements. In the region of the working volume of a main field magnet having a bore diameter of approximately 90 cm, the magnetic field profile generated by a small homogenizing element with dimensions of e.g. $40 \times 40 \times 0.3$ mm$^3$ is almost identical to that of a magnetic dipole with known dipole moment and is therefore easy to calculate, Homogenization of the magnetic field in the working volume of the main field magnet using the ferromagnetic homogenizing elements is basically effected by initially measuring the generally still inhomogeneous profile of the magnetic field in the working volume at a plurality of locations. Subsequently, the measured values are used as input data record for a numerical calculation program which, in a first calculation step, permits calculation of a geometric arrangement of the ferromagnetic homogenizing elements at predetermined locations, whose additional magnetic field profile largely compensates the original inhomogeneities of the magnetic field of the main field magnet in the working volume. When disc-shaped homogenizing elements are used, several homogenizing elements can be stacked on top of one another at a plurality of predetermined locations.

The homogenizing elements are then mounted on the mechanical support bodies at the predetermined locations within the bore of the main field magnet corresponding to the geometric arrangement determined by the numerical calculation program. Subsequently, the profile of the magnetic field in the working volume of the main field magnet, which is in general more homogeneous, is re-measured in a second measuring step. The measured values can be used as input data to calculate changes in the geometric arrangement of the homogenizing elements in the numerical calculation program, and geometric arrangement of the homogenizing elements can be changed accordingly. This enables an iterative improvement of the geometric arrangement of the homogenizing elements for achieving a homogeneous magnetic field in the working volume of the main field magnet of the magnetic resonance apparatus.

U.S. Pat. Nos. 5,485,088 and 5,959,454, e.g., disclose the use of permanent magnetic material for the ferromagnetic homogenizing elements. Homogenizing elements of permanent magnetic material must be magnetized in a magnetic field which is stronger than the coercive field strength of the material, before actually being used in the main field magnet in a magnetic resonance apparatus. In principle, they can then be used with any direction of magnetization relative to the direction of the magnetic field of the main field magnet and even with the opposite direction. Furthermore, with disc-shaped homogenizing elements, it is possible to generate a direction of magnetization parallel to the normal direction of the disc. This is required, e.g., with main field magnets having the geometry described in U.S. Pat. No. 5,959,454. In order to permit calculation of the profile of the magnetic field strength generated by the homogenizing elements of permanent magnetic material in the working volume of the main field magnet, thereby making them of practical use for homogenizing methods, the state of magnetization must remain constant or change only slightly during installation of the homogenizing elements in the main field magnet. This is the case with only very few materials, such as NdFeB or Smco alloys.

Homogenizing methods using ferromagnetic homogenizing elements have the fundamental advantage that the large number of possible positions for the homogenizing elements create a corresponding large number of degrees of freedom for compensating even complicated field profiles of the still somewhat inhomogenous magnetic field of the main field magnet compared to methods using correction coils with adjustable currents having a relatively small number of degrees of freedom corresponding to the number of correction coils.

The fundamental disadvantage of homogenizing methods using ferromagnetic homogenizing elements is that the homogenizing elements have, for practical reasons, a minimum size which limits the precision with which deviations from the homogeneous profile of the magnetic field can be compensated. In contrast thereto, methods using correction coils with adjustable currents permit precise adjustment of the profiles of magnetic fields for compensation of inhomogeneous magnetic fields.

A basic precondition for the applicability of homogenizing methods using ferromagnetic homogenizing elements is that suitable distributions of the homogenizing elements at the predetermined positions be capable of determination using the profile of the magnetic field determined in a previous measuring step via theoretical means only, i,e. using numerical calculation programs, Subsequently, these methods can be used successfully only if the model used in the numerical calculation method for the theoretical calculation of the profile of the magnetic field strength generated by the homogenization elements, coincides to a sufficient degree with the actual profile of the homogenization elements used. Should the theoretical model correspond exactly to reality, homogenization can be effected with only one measuring step, one calculation-step and one occupation step. In case of only minor deviations, homogenization is generally possible in several iterations in which the deviations from the homogeneous profile of the magnetic field are successively reduced. In contrast thereto, should the deviations between the theoretical model and reality be sufficiently large, the method according to U.S. Pat. No. 5,045, 794 e.g. is not successful even with iterative steps, since the iterative method no longer converges. Such deviations between the results of a theoretical model and the real magnetic behavior of the homogenizing elements may, of course, be simply due to an unreliable theoretical model or be due to mechanical tolerances in connection with the occupation of the support bodies by the homogenizing elements and also to tolerances with respect to the strength and direction of magnetization of the homogenizing elements Larger tolerances with respect to the strength and direction of magnetization of the homogenizing elements can occur in particular with homogenizing elements made from permanent magnetic material, since these values are influenced by the production method of the homogenizing elements and a more exact characterization of the errors occurring thereby would be too demanding in practice.

Use of ferromagnetic homogenizing elements made from soft iron for homogenization of the magnetic field of typically relatively large main field magnets for medical diagnosis, having a tubular bore with bore diameters of approximately 90 cm, has been successful and is established in practice. However, application of the method to the homogenization of e.g. the considerably smaller main field magnet according to U.S. Pat. No. 5,959,454 proves to be problematic and the described iterative method no longer converges For the above-mentioned reasons, the use of homogenizing elements of permanent magnetic material whose strength and direction of magnetization is inaccurate due to manufacturing, is required here. Furthermore, it has turned out that the main field magnet having the dimensions described by way of example in U.S. Pat. No. 5,959,454 must be provided with homogenizing elements at the bottom of a V-shaped depression mentioned therein, which are then located at a very small separation (approximately 3 cm) from the center of the working volume, compared to 45 cm in the above-mentioned magnet having a bore diameter of 90 cm. Thus, mechanical tolerances generate relatively large errors in the magnetic field contribution produced by the homogenizing elements when these elements are positioned. There is also the additional problem that the dimensions of the cylindrical homogenizing elements are relatively large, having a diameter of 5 mm and a height of 0.4 mm, relative to their short distance from the center of the working volume, As a result thereof, deviations of the magnetization or the position from the expected value have a relatively strong effect on the contribution to the magnetic field. Further reduction of the dimensions would inadmissibly hinder the handling of the homogenizing elements in the magnetized state due to the magnetic forces which occur.

One would expect that known iterative methods of homogenization would not converge when errors in contributions of the homogenizing elements to the overall magnetic field approach the order of magnitude of the field inhomogeneities which are to be compensated.

In contrast thereto, it is the purpose of the present invention to modify a method of the kind described above in such a way that reliable convergence of the iteration steps and thus improvement of the homogeneity of the main magnetic field is achieved even if errors in contributions by the homogenizing elements to the entire magnetic field approach the order of magnitude of the field inhomogeneities which are to be compensated.

SUMMARY OF THE INVENTION

This object is achieved in a surprising and also effective manner in that, in a first measuring step, the profile of the magnetic field of the main field magnet in its working volume is determined by measurements, and the measured values are used as input data in a numerical calculation program which uses said input data, in a first calculation step, to calculate locations of homogenizing elements which render the overall calculated field, i.e. the superposition of the magnetic field of the main field magnet with that of all homogenizing elements, approximately theoretically homogeneous. In a first compensation step, the homogenizing elements are placed at these predetermined positions and in amounts calculated in the first calculating step. In one or more subsequent iterations, the dependence of the magnetic field in the working volume is measured for each iteration, after which, for further improvement of the homogeneity, a change in the occupation positions of the homogenizing elements is calculated in a further calculation step and carried out in a further compensating step. The predetermined positions of the homogenizing elements are divided into groups having different distances from the geometric center of the working volume and, starting with the second calculation step and the second compensation step, the occupation of the positions of the group having the shortest distances from the center of the working volume is no longer changed.

Towards this end, each of the predetermined positions of the homogenizing elements is uniquely associated with a certain group however, the distances of positions of different groups from the center of the working volume may overlap in certain regions. Nevertheless, the mean value of the distances of the positions within a group results in a hierarchy among the groups themselves, starting from the group with the shortest distances to the group with the largest distances from the center of the working volume, With the inventive measures, starting from the second calculation step and the second compensation step, only positions with larger distances from the center of the working volume are changed. This reduces the influence on the magnetic field to be homogenized as compared to changes in homogenizing elements in the region closer to the center. Consequently, even with relatively large errors in the contributions of the homogenizing elements to the overall field, which may be caused e.g. by inaccurate positioning, by deviations in the magnetic field characteristics of the homogenizing elements from the ideal state, and by other factors, the remaining influence of those homogenizing elements whose positions and numbers are changed after the second step is considerably smaller than in conventional iterative methods in which all possible positions of homogenizing elements are available for a change in the respective following iteration For this reason, the iterative method can converge even with relatively large error contributions from the individual homogenizing elements, as long as the error contributions of the remaining homogenizing elements which are yet to be varied are smaller than the remaining error in the overall field being compensated. The apparent disadvantage that the possibilities for variation of the occupations are limited after the second step of the iterative method, actually proves to be the key to the solution of the above-defined object of the invention, since the limitation of further possibilities for the variation defines new degrees of freedom.

Features and advantages of the invention are shown in the following description of embodiments of the invention with reference to the drawings, which show essential details of the invention, and with reference to the claims. The individual features may be realized separately or collectively in any arbitrary combination in embodiments of the invention

DESCRIPTION OF THE PREFERRED EMBODIMENT

Figure 1:
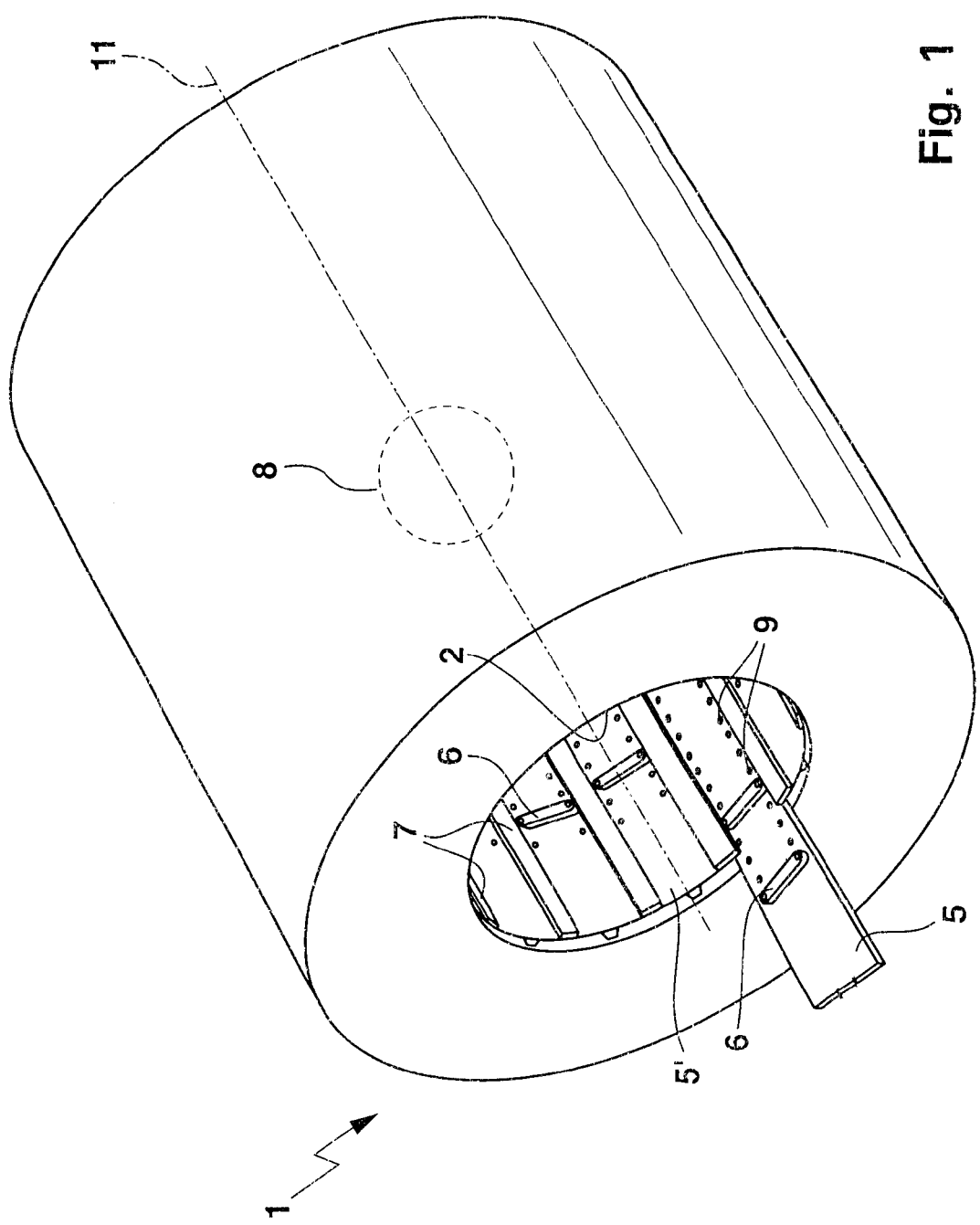
FIG. 1 shows a schematic representation of the main field magnet in a nuclear magnetic resonance apparatus having homogenizing elements at predetermined positions.

FIG. 1 shows, in a highly schematized manner, a conventional superconducting main field magnet 1 of a nuclear magnetic resonance tomograph with an axial room temperature bore 2. The working volume 8 is located in the central area of the room temperature bore 2. The inner wall of the room temperature bore 2 is provided with axial guides 7 into which holders 5 can be inserted, having different positions 9 at which ferromagnetic homogenizing elements 6, e.g. shim plates can be stacked and fixed. The holders 5 are inserted into the guides 7 and fixed. It would also be possible to provide a common cylindrically-symmetrical holder.

The stacked shim plates are each mounted onto a translator which may displace them in a radial direction with respect to the axis 11 in order to approach the positions 9.

Figure 2:
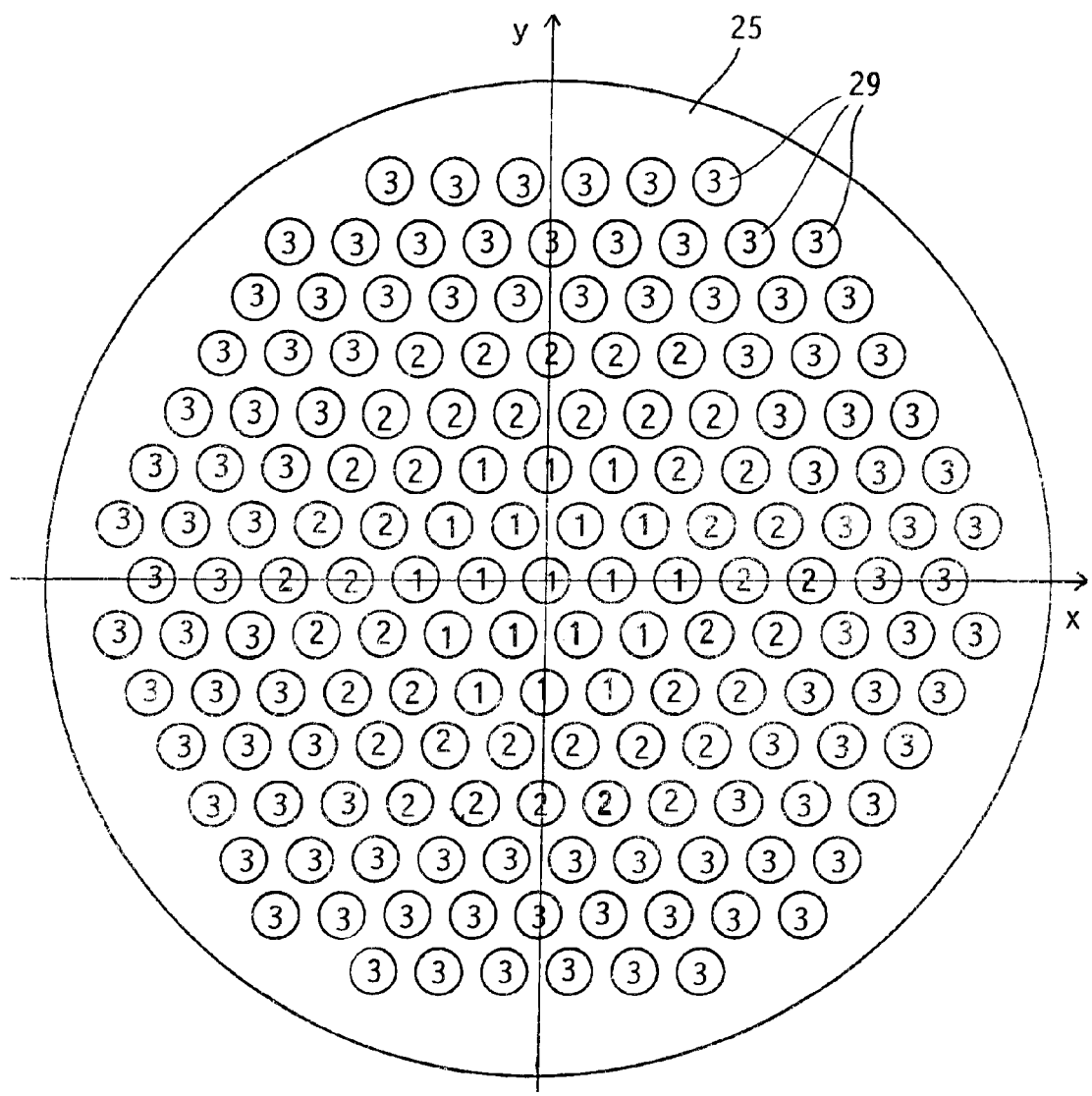
FIG. 2 shows a schematic plan view, in the direction of the z axis, onto a support plate with predetermined positions of the homogenizing elements.

FIG. 2 shows a support plate 25 onto which a calculated number of ferromagnetic homogenizing elements 6, e.g. in the form of permanent magnetic shim plates, can be mounted at each of the positions 29. Each of the numbers in the circles representing the positions 29 indicate the positions which are occupied in respective iteration steps corresponding to the groups formed according to the invention.

The support plate 25 may be placed e.g. onto the pole shoe of a main field magnet or may be inserted into a magnet arrangement according to U.S. Pat. No. 5,959,454 and e.g. fixed at the position of the gradient system provided therein.

One embodiment of the inventive method is particularly preferred in which, in further iterations, the occupation of the positions 9,29 of the respective group located at the next to the largest distance from the center, is not changed.

In this way one can avoid transfer of the relatively large errors of the compensation contributions from the groups at positions closer to the center to the respective subsequent finer compensation step.

One variant of the method is also particularly preferred in which, in the first compensation step, homogenizing elements 6 only occupy positions 9,29 of the group having the shortest distances from the center. In this way, the influence of the occupation of positions by homogenizing elements 6 which are themselves error-inducing, is determined without disturbances in each subsequent measuring step, thereby preventing error contributions of elements 6 at further removed regions from disturbing the measurement. This also reduces the amount of effort, since in the first compensation step, only part of the predetermined positions need be occupied with homogenizing elements 6. The influence of the homogenizing elements 6 at the unoccupied positions which are removed from the center on the overall field would in any event be relatively small.

In an advantageous further development of this variant which presents a consistent application of the principle of the embodiment of the inventive method described above, in each further compensation step, the homogenizing elements 6 only occupy positions 9,29 in the group located at a next largest distance from the center. The inventive method is particularly effective in this embodiment and requires the least amount effort.

In practice, it has proven to be particularly advantageous if the groups are defined such that, within the group having the shortest distances to the center of the working volume 8, the ratio between the largest and shortest distance is less than 1.6, preferably smaller than $\sqrt{2}$.

In variants of the inventive method, the shortest distance of a predetermined position 9,29 from the center may be smaller than 5 cm. With such a geometric arrangement, with the homogenizing elements 6 being located at such a short distance from the center of the working volume 8, conventional compensation methods would completely fail, due to the relatively high error contributions of the typical homogenizing elements 6. In contrast, the inventive method has a good chance of converging.

It is also possible, in modifications of the inventive method, to select the ratio between the shortest distance of a position from the center of the working volume 8 and the cube root of the volume of the largest homogenizing element 6 used to be less than 40, preferably less than 30. In this way, the method can converge even with homogenizing elements 6 being located close to the center and having a very strong influence on the overall field. Conventional methods have not been capable of convergence in such difficult cases.

In order to also be able to generate negative magnetic moments using homogenizing elements 6 and irrespective of the strength and direction of the main field magnet to be compensated, a particularly preferred variant of the inventive method uses permanent magnets as homogenizing elements 6.

The use of homogenizing elements 6 in the form of plates is also particularly preferred. Such plates can be stacked in suitable numbers and disposed at predetermined positions 9,29 as calculated to influence the magnetic field in a selected, finely controlled fashion.

I claim:

1. An iterative method of homogenizing the magnetic field in the working volume of the main field magnet of a magnetic resonance apparatus using ferromagnetic homogenizing elements which are mounted on one or more support bodies at predetermined positions, wherein, in a first measuring step, the profile of the magnetic field of the main field magnet in its working volume is determined through measuring and the measured values are used as input data in a numerical calculation program to, in a first calculation step, calculate a distribution of homogenizing elements at the predetermined positions using said input data such that the overall calculated field, consisting of the superposition of the magnetic field of the main field magnet with all homogenizing elements, is theoretically approximately homogeneous and, in a first compensation step, the homogenizing elements are placed at predetermined positions and in amounts calculated in the first calculation step and wherein, subsequently, in one or more iterations, the magnetic field profile in the working volume is determined in a further measuring step, and for further improvement of the homogeneity, a change in occupation of the positions by the homogenizing elements is calculated in a further calculation step and carried out in a further compensation step, characterized in that the predetermined positions of the homogenizing elements are divided into groups having different distances from a geometric center of the working volume and, starting from the second calculation step and the second compensation step, an occupation of the positions of the group having shortest distances from the center of the working volume is no longer changed.

2. The method according to claim 1, characterized in that, in each further iteration, an occupation of positions of a respective group being located at a subsequent larger distance from the center is no longer changed.

3. The method according to claim 1, characterized in that, in the first compensation step, the homogenizing elements occupy only positions in the group having shortest distances from the center.

4. The method according to claim 3, characterized in that, in further compensation steps, the homogenizing elements only occupy positions of a respective group located at a subsequent larger distance from the center.

5. The method according to claim 2, characterized in that, in the first compensation step, the homogenizing elements only occupy positions in the group having the shortest distances from the center.

6. The method according to claim 1, characterized in that, within the group having shortest distances from the center of the working volume, a ratio between a largest and a shortest distance is smaller than 1.6.

7. The method according to claim 2, characterized in that, within the group having the shortest distances from the center of the working volume, a ratio between a largest and a shortest distance is smaller than 1.6.

8. The method according to claim 3, characterized in that, within the group having the shortest distances from the center of the working volume, a ratio between a largest and a shortest distance is smaller than 1.6.

9. The method according to claim 4, characterized in that, within the group having shortest distances from the center of the working volume, a ratio between a largest and a shortest distance is smaller than 1.6.

10. The method according to claim 5, characterized in that, within a group having the shortest distances from the center of the working volume, a ratio between a largest and a shortest distance is smaller than 1.6.

11. The method according to claim 1, characterized in that a shortest distance of an homogenizing element from the center is selected to be less than 5 cm.

12. The method according to claim 2, characterized in that a shortest distance of an homogenizing element from the center is selected to be less than 5 cm.

13. The method according to claim 3, characterized in that a shortest distance of an homogenizing element from the center is selected to be less than 5 cm.

14. The method according to claim 1, characterized in that a ratio between a shortest distance of a position from the center of the working volume and a cube root of a volume of a largest homogenizing element is selected to be smaller than 40.

15. The method according to claim 2, characterized in that a ratio between a shortest distance of a position from the center of the working volume and a cube root of a volume of a largest homogenizing element is selected to be smaller than 40.

16. The method according to claim 3, characterized in that a ratio between a shortest distance of a position from the center of the working volume and a cube root of a volume of a largest used homogenizing element is selected to be smaller than 40.

17. The method according to claim 4, characterized in that a ratio between a shortest distance of a position from the center of the working volume and a cube root of a volume of a largest homogenizing element is selected to be smaller than 40.

18. The method according to claim 6, characterized in that a ratio between a shortest distance of a position from the center of the working volume and a cube root of a volume of a largest homogenizing element is selected to be smaller than 40.

19. The method according to claim 1, characterized in that permanent magnets are used as homogenizing elements.

20. The method according to claim 1, characterized in that the homogenizing elements are selected to be plates.

* * * * *